United States Patent
Jacquet

(10) Patent No.: US 6,865,195 B2
(45) Date of Patent: Mar. 8, 2005

(54) EDGE-EMITTING SEMICONDUCTOR TUNABLE LASER

(75) Inventor: Joël Jacquet, Limours (FR)

(73) Assignee: Avanex Corporation, Fremont, CA (US)

(*) Notice: Subject to any disclaimer, the term of this patent is extended or adjusted under 35 U.S.C. 154(b) by 175 days.

(21) Appl. No.: 10/089,569

(22) PCT Filed: Aug. 2, 2001

(86) PCT No.: PCT/FR01/02530
§ 371 (c)(1),
(2), (4) Date: Apr. 2, 2002

(87) PCT Pub. No.: WO02/13335
PCT Pub. Date: Feb. 14, 2002

(65) Prior Publication Data
US 2002/0151126 A1 Oct. 17, 2002

(51) Int. Cl.[7] .................................. H01S 3/10
(52) U.S. Cl. ......................... 372/20; 372/32
(58) Field of Search .............. 372/20, 30, 107, 372/97, 39, 22, 6, 9, 28, 75, 34, 25, 32, 64, 92

(56) References Cited

U.S. PATENT DOCUMENTS

| 4,786,132 A | * | 11/1988 | Gordon | 385/38 |
| 4,839,308 A | * | 6/1989 | Fye | 438/29 |
| 4,860,305 A | * | 8/1989 | Miyauchi et al. | 372/92 |
| 4,920,542 A | * | 4/1990 | Brosson et al. | 372/50 |
| 5,001,722 A | * | 3/1991 | Klement et al. | 372/99 |
| 5,363,397 A | * | 11/1994 | Collins et al. | 372/92 |
| 5,384,799 A | * | 1/1995 | Osterwalder | 372/32 |
| 5,521,932 A | * | 5/1996 | Marshall | 372/36 |
| 5,572,543 A | * | 11/1996 | Heinemann et al. | 372/107 |
| 5,835,650 A | * | 11/1998 | Kitaoka et al. | 385/49 |
| 5,960,259 A | * | 9/1999 | Kitaoka et al. | 438/106 |
| 6,021,141 A | * | 2/2000 | Nam et al. | 372/20 |
| 6,025,939 A | * | 2/2000 | Lowenhar et al. | 359/34 |
| 6,192,059 B1 | * | 2/2001 | Karioja et al. | 372/20 |
| 6,201,629 B1 | * | 3/2001 | McClelland et al. | 359/223 |
| 6,201,638 B1 | * | 3/2001 | Hall et al. | 359/346 |
| 6,261,858 B1 | * | 7/2001 | Kitaoka et al. | 438/31 |
| 6,263,002 B1 | * | 7/2001 | Hsu et al. | 372/6 |
| 6,449,296 B1 | * | 9/2002 | Hamasaki et al. | 372/36 |
| 6,459,711 B1 | * | 10/2002 | Hamaguchi et al. | 372/36 |
| 6,487,224 B1 | * | 11/2002 | Ohashi et al. | 372/43 |

FOREIGN PATENT DOCUMENTS

JP 06-188497 * 7/1994 ........... H01S/3/105

OTHER PUBLICATIONS

Uenishi Y. et al: "Tunable Laser Diode using a nickel Micromachined External Mirror" Electronics Letters, IEE Stevenage, GB, vol. 32, No. 13, Jun. 20, 1996, pp. 1207–1208, XP000965745 ISSN:0013–5194.*

(List continued on next page.)

Primary Examiner—Mingun Oh Harvey
Assistant Examiner—Tuan N. Nguyen
(74) Attorney, Agent, or Firm—Moser, Patterson & Sheridan, L.L.P.

(57) ABSTRACT

The invention concerns a tunable edge-emitting semiconductor laser (10) including a resonant cavity delimited by two reflectors (15, 20), one of which is a fixed reflector (15) and the other of which is a mobile reflector (20), and including an active section (1) with gain of length $L_1$ and a tunable section (2) of length $L_2$, characterized in that the total length of the cavity $L=L_1+L_2$ is less than or equal to 20 µm.

18 Claims, 3 Drawing Sheets

OTHER PUBLICATIONS

Y. Ueishi et al, "Tunable laser Diode Using a Nickel Micromachined External Mirro", Electronics Letters, IEE Stevenage, Great Britain, vol. 32, No. 13, Jun. 20, 1996, pp. 1207–1208, XP000965745.

T. Baba et al, "A Novel Short–Cavity Laser with Deep–Grating Distributed Bragg Reflectors", Japanese Journal of Applied Physics, Publication Office Japanese Journal of Applied Physics, Tokyo, Japan, vol. 35, No. 2B, Feb. 1, 1996, pp. 1390–1394, XP000701047.

Patent Abstracts of Japan, vol. 1998, No. 2, Jan. 30, 1998 corresponding to JP 09 260768 A (Nippon Telegr & Amp..) dated Oct. 3, 1997.

"Embedded Semiconductor Laser with Anti–Reflection coatings", IBM Technical Disclosure Bulletin, US, NY, vol. 34, No. 5, Oct. 1, 1991, pp. 141–142, XP000189657.

E. Hoefling et al, "Edge–Emitting Gainas–A 1 Gaas Microlasers", IEEE Photonics Technology Letters, IEEE, Inc. New York, US, vol. 11, No. 8, Aug. 1999, pp. 943–945, XP000860958.

* cited by examiner

EDGE-EMITTING SEMICONDUCTOR TUNABLE LASER

The present invention relates to an edge-emitting tunable semiconductor laser which includes a laser cavity that is made short to prevent mode skipping.

Laser diodes are routinely used as tunable sources in optical data transmission applications. In this context, it is important to achieve a wide tuning range, i.e. a wide range of laser emission wavelengths, without fear of mode skipping degrading optical transmission quality.

The FIG. 1 graph shows the tuning range of a "standard" distributed Bragg reflector (DBR) laser. The graph shows the laser emission wavelength in nm as a function of the control current in milliamps (mA) applied to the electrode of the tuning section of the laser. The control current varies the number of carriers in the active layer of the tuning section and influences the laser emission wavelength. As a general rule, the gain section of a DBR laser has a length from 300 micrometers ($\mu$m) to 900 $\mu$m. For a tuning range $\Delta\lambda=17$ nanometers (nm), the laser emits 35 different modes.

Mode skipping is also inevitable when a "standard" tunable laser is used in association with the micro-electromechanical (MEM) tuning technology, which varies the length of the resonant cavity of the laser. It has been established that varying the length L of the laser cavity varies the laser emission wavelength $\lambda$. The variation in the length L is of the same order of magnitude as the variation in the wavelength $\lambda$.

A laser of the above kind is shown in the paper "Tunable laser diode using a nickel micromachined external mirror" by Y. Uenishi, K. Honma and S. Nagaoka published in Electronics Letters, 20 Jun. 1996, Vol. 32, No. 13.

FIGS. 2a and 2b are diagrams of a standard MEM tunable laser. The laser diode 10 includes a cavity delimited by two reflectors, one of which is a fixed reflector and the other of which is a mobile reflector. The length of the laser diode 10 is approximately 300 $\mu$m and the laser diode has a fixed mirror, for example a cleaved mirror, at the front. Varying the length of the cavity tunes the laser. To vary the length of the resonant cavity by means of an MEM controller 25, a nickel mirror 20 is placed to the rear of the laser diode 10, which is mounted on a base 50. A tuning range of 20 nm has been obtained, with an accuracy of 0.01 nm. Nevertheless, the FIG. 2b graph shows clearly that this tuning range is not continuous, and that it suffers from mode skipping.

Mode skipping must be avoided in applications to dense optical communication systems, which generally include wavelength division multiplexers. Tunable lasers are often associated with wavelength division multiplexing (WDM) systems, the density of which is continually increasing.

Many other tunable lasers are available off the shelf and most of them can be grouped into four families.

The tuning range of distributed feedback (DFB) Lasers is affected by temperature. The output power is high, at approximately 30 mW to 40 mW, but the tuning range is limited to only 2 nm, which is insufficient for applications to WDM systems.

"External cavity" lasers have a tuning mechanism consisting of an external bulk optical component, such as a filter or a grating, for example. However, external cavity lasers are too costly and heavy to be implemented in WDM telecommunication networks. What is more, their reliability has yet to be proven.

Multi-section lasers are tuned by electrically controlling their different sections, which can consist of DFB, DBR, sampled grating DBR (SG-DBR), or temperature-sensitive lasers. Multi-section lasers have a good tuning range, of approximately 15 nm to 50 nm, with an appropriate output power, from approximately 5 milliwats (mW) to approximately 20 mW, although these values depend essentially on the type of laser used for each section. However, multi-section lasers are complex to implement and have complex parameters, and their resistance to aging is as yet not well understood.

The fourth family of tunable lasers consists of vertical-cavity surface-emitting lasers (VCSEL), which are associated with the MEM technology.

A vertical-cavity surface-emitting laser is described in the paper "2 mW CW single mode operation tunable 1550 nm vertical cavity emitting laser with 50 nm tuning range" by D. Vakhshoori, P. Tayebati, Chih-Cheng Lu, M. Azimi, P. Wang, Jiang-Huai Zhou and E. Canoglu, published in Electronic Letters, 27 May 1999, Vol. 35, No. 11. FIG. 3 shows a vertical-cavity surface-emitting laser.

The laser 10 shown in FIG. 3 includes a substrate 8 (of InP, for example) and an active region 11 extending through the cavity between a fixed reflector 28 and a mobile reflector 25. The mobile mirror is electrically controlled by means of a suspended membrane 26 to vary the length of the cavity to tune the emission wavelength of the laser.

This kind of laser has technological limitations, however. They concern, on the one hand, reliability, and the strength of the membrane 26 that controls the mobile mirror 25 and, on the other hand, the fabrication process, which necessitates thinning of the substrate 8 by selective etching at the level of the cavity.

What is more, because of the high gain needed to obtain the laser effect in a cavity that is this small (shorter than 1 $\mu$m), the high optical losses associated with diffraction, and the increase in the temperature of the junction due to poor dissipation, it is mandatory to use an optical pumping source, which complicates assembling the laser and adds to its cost.

The objective of the present invention is to remove the drawbacks of the prior art.

To this end, the invention proposes a tunable laser which has a continuous tuning range of approximately 30 nm and which is easy to make, implement and control. The edge-emitting laser according to the invention has optical losses at the threshold which are acceptable for a wide tuning range without mode skipping.

The present invention relates more particularly to a tunable edge-emitting semiconductor laser including a resonant cavity delimited by two reflectors, one of which is a fixed reflector and the other of which is a mobile reflector, and including an active section with gain of length $L_1$ and a tunable section of length $L_2$, which laser is characterized in that the total length of the cavity $L=L_1+L_2$ is less than or equal to 20 $\mu$m.

According to one feature, the length $L_1$ of the active section is from 5 $\mu$m to 12 $\mu$m.

According to another feature, the length $L_2$ of the tunable section depends on the tuning range of the laser in accordance with the following equation:

$$\Delta\lambda=\lambda^2/2(n_1L_1+n_2L_2)$$

where $\Delta\lambda$ is the tuning range of the laser, $\lambda$ is the emission wavelength of the laser, and $n_1$, $n_2$ are the respective refractive indices of the first and second sections of the laser cavity.

According to one feature, the laser has a continuous tuning range $\Delta\lambda$ greater than or equal to 30 nm.

According to one feature, the fixed reflector and the mobile reflector each have a reflectivity greater than or equal to 90%.

According to one feature, the fixed reflector is an etched mirror on the front face of the active section.

In respective embodiments, the etched mirror of the fixed reflector is an alternation of semiconductor and air, an alternation of polymer and air, or an alternation of semiconductor and polymer.

According to another feature, the rear face of the active section is antireflection treated.

According to another feature, the mobile reflector is a mirror external to the laser cavity.

In respective embodiments, the mobile reflector is of etched silicon, nickel, or dielectric deposited on silicon.

According to one feature, the mobile reflector is controlled by a micro-electro-mechanical (MEM) controller.

In one embodiment, the tunable section is an air area.

In another embodiment, the tunable section is a gas area.

The invention also provides a method of fabricating a tunable edge-emitting semiconductor laser, which method is characterized in that it includes the following steps:

producing a laser die including a substrate and an active layer consisting of a gain medium, the length $L_1$ of the gain medium being from 5 μm to 12 μm, producing a fixed etched mirror on the front face of the laser die, mounting the laser die on a base, and producing a mobile reflector on the base to the rear of the laser die.

In a first embodiment, producing the etched mirror includes the following steps:

etching the active layer of the laser die, depositing a polymer in the etched area, and etching the polymer to constitute a mirror.

In a second embodiment, producing the etched mirror includes the following steps:

etching the active layer of the laser die, further epitaxial growth in the etched area of an undoped semiconductor transparent at the emission wavelength, and etching the transparent undoped semiconductor to constitute a mirror.

In a third embodiment, producing the etched mirror further includes a step of depositing a polymer in the etched regions of the transparent undoped semiconductor.

The invention neatly provides an edge-emitting laser whose cavity is sufficiently short to avoid mode skipping over a wide tuning range, whilst limiting optical losses at the threshold.

Moreover, edge-emitting lasers are easier to make and implement than vertical-cavity surface-emitting lasers.

What is more, the MEM tuning technology is simple to control and stable with respect to time and external temperature conditions.

Other features and advantages of the present invention will become apparent in the course of the following description, which is given by way of illustrative and non-limiting example and with reference to the drawings, in which:

FIG. 1, which has already been described, is a graph of the emission wavelength of a standard DBR laser as a function of the control current.

FIG. 2a, which has already been described, is a diagram of a standard laser associated with the prior art MEM technology.

FIG. 2b, which has already been described, is a graph of the emission wavelength of the FIG. 2a laser as a function of the control voltage.

The following description relates to a monomode tunable laser with a continuous tuning (i.e. emission wavelength) range of approximately 30 nm.

Figure 1:
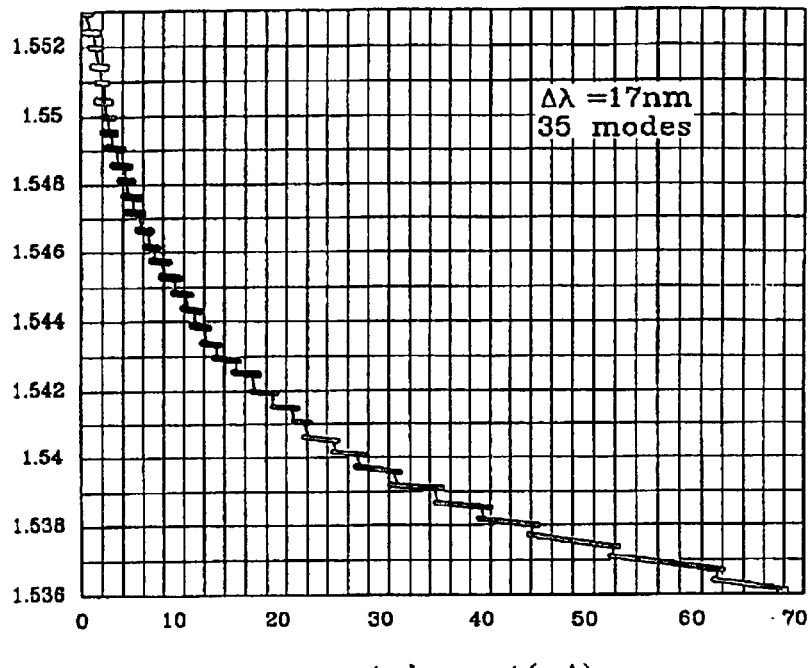
Figure 2A:
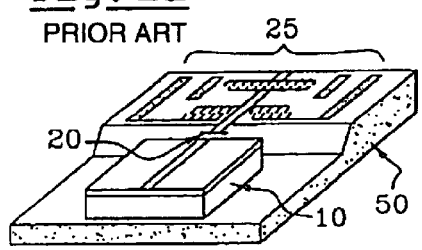
Figure 2B:
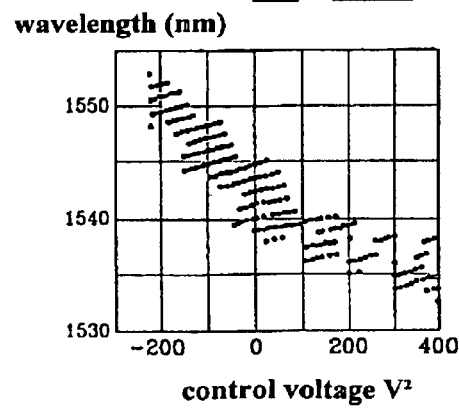
Figure 3:
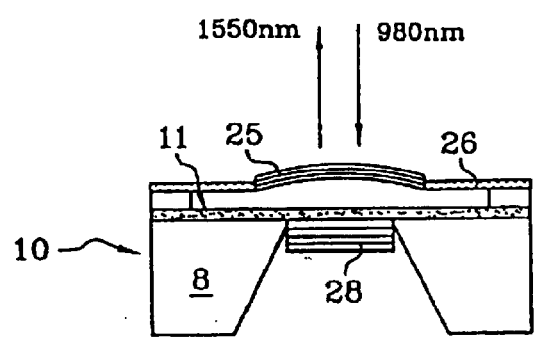
FIG. 3 is a diagrammatic view in section of a prior art MEM-VCSEL laser.
Figure 4:
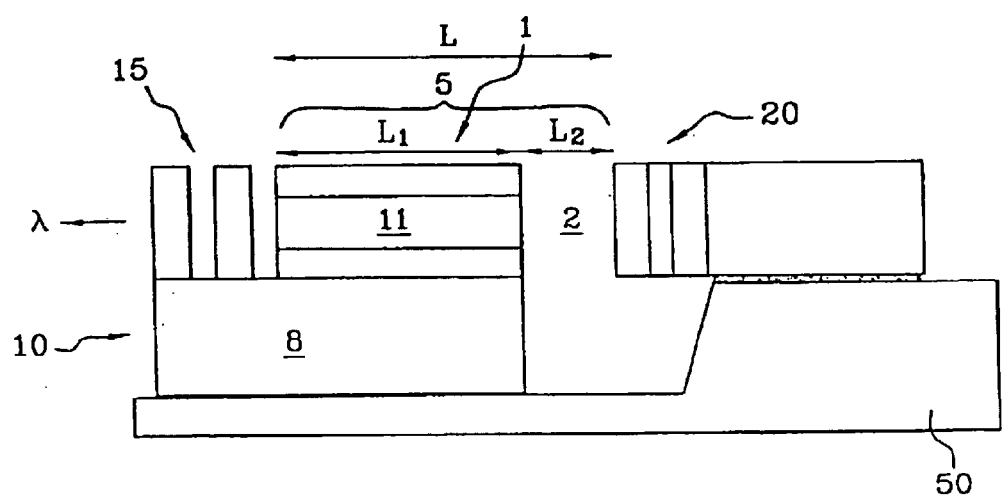
FIG. 4 is a diagrammatic view in section of a tunable laser according to the invention.

The laser according to the invention, shown in FIG. 4, includes a cavity 5 of length L delimited by two reflectors 15 and 20.

According to the invention, the cavity 5 is divided into two sections, an active section 1 with gain including an active layer 11 of length $L_1$ and a tunable section 2 of length $L_2$. According to one essential feature of the invention, the total length of the cavity $L=L_1+L_2$ is less than or equal to 20 μm. The terms active section 1 and tunable section 2 of the cavity 5 are used hereinafter.

WDM optical systems typically necessitate a continuous tuning range Δλ of at least 30 nm. In other words, it is necessary for the spacing between two resonant modes to be not less than 30 nm.

This Fabry-Perot spacing Δλ between two resonant modes is given by the following equation:

$$\Delta\lambda = \lambda^2/2(ng*L)$$

In the above equation, ng is the effective index of the waveguide and λ is the emission wavelength of the laser.

This yields the following condition in respect of the length L of the cavity:

$$L < \lambda^2/2(ng*\Delta\lambda)$$

For example, for λ=1.55 μm, ng=3.3 (the index of the InP guide 11 if the second section is considered to be air) and Δλ=30 nm, the condition obtained in respect of the length L of the cavity is: L<12 μm.

This condition in respect of the total length L of the cavity 5 depends greatly on fabrication and emission conditions and the required tuning range.

A laser die 10 is preferably produced such that the length $L_1$ of the active section 1 is from 5 μm to 12 μm.

The length $L_2$ of the tunable section 2 then depends on the required tuning range, in accordance with the following equation:

$$\Delta\lambda = \lambda^2/2(n_1 L_1 + n_2 L_2)$$

where Δλ is the tuning range of the laser,

λ is the emission wavelength of the laser, and $n_1$, $n_2$ are the respective refractive indices of the first and second sections of the laser cavity.

The equation expresses the fact that the laser cavity is defined so that there is only one resonant mode over the tuning range Δλ. One consequence of this equation is monomode operation of the laser.

Figure 5:
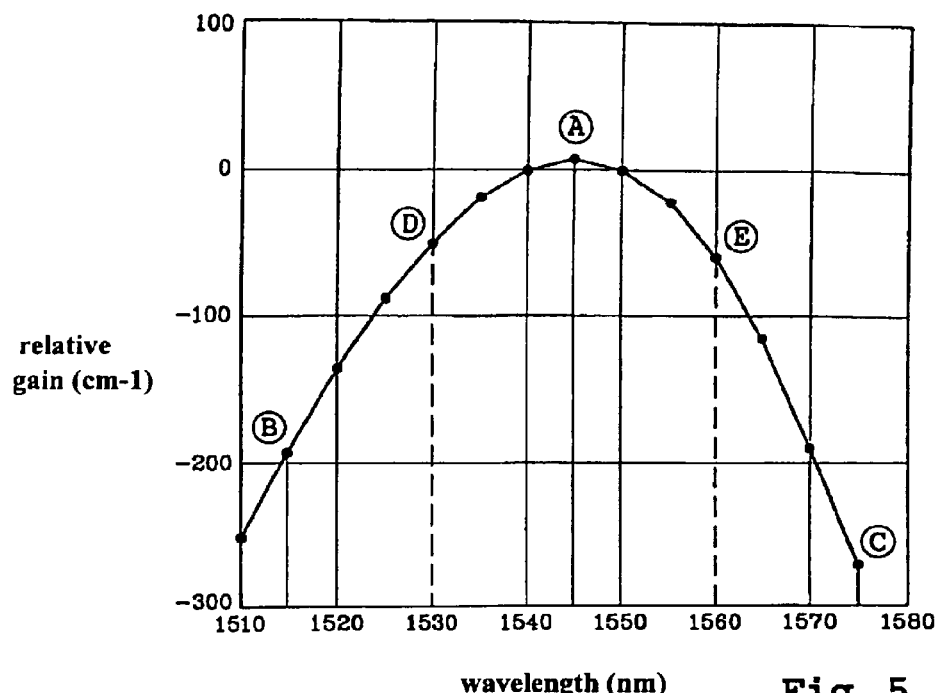
FIG. 5 is a graph of the gain of the material of the active section of the laser according to the invention as a function of the emission wavelength.

In FIG. 5, the gain g of the material of the active section 1 is plotted as function of the emission wavelength λ of the laser. The equation used is as follows:

$$g = g_o + 2.66\Delta\lambda - 0.247(\Delta\lambda)^2 - 0.00171(\Delta\lambda)^3$$

Considering a resonant mode at the maximum of the gain curve (point A at 1545 nm), the secondary modes must be at 30 nm (points B and C). The material gain for points B and C is less than −250 cm$^{-1}$ and +6 cm$^{-1}$ for the principal mode at point A. The laser therefore emits only one mode, because one generally accepted criterion for qualifying a laser as a monomode laser is a gain difference of only 5 cm$^{-1}$ between the principal mode and the secondary modes.

Considering a less favorable case with two resonant modes close to the ends of the tuning range (points D at 1530 nm and E at 1560 nm), the laser could exhibit dual mode operation, oscillating between the two modes, because of the small material gain difference between the two. To prevent this kind of operation it suffices to generate a gain variation of at least 5 cm$^{-1}$ and to move the resonant modes a further 1 nm apart for a component tunable over 30 nm (from the equation for g(λ) previously discussed). For complete rigor, the previous tuning range equation must therefore be written:

$$\Delta\lambda + 1 = \lambda^2/2(n_1L_1 + n_2L_2)$$

The problem that the invention must solve is then to produce a cavity for an edge-emitting laser as small as this ($L_1$ from 5 μm to 12 μm).

The cavity 5 is delimited by two reflectors 15 and 20. With an active section 1 having a length $L_1$ from 5 μm to 12 μm, it is not possible to produce a fixed mirror 15 by the classic cleaving technique, the accuracy of which is of the order of ±5 μm.

The prior art technique of Bragg stacking, used to produce mirrors on the surface of components such as VCSEL, cannot be applied to producing mirrors on the edge of components like the edge-emitting lasers that are of interest here.

The fixed reflector 15 must therefore be an etched mirror. Several techniques can then be envisaged.

A first technique consists of etching the active layer 11 of the laser diode 10 as far as the substrate 8, followed by further epitaxial growth (known as "butt coupling") of a non-active material that is transparent at the emission wavelength of the laser, in which the mirror 15 can be etched. The material used for this further epitaxial growth (butt coupling) is preferably undoped InP (index 3.17). Wet or dry etching of the epitaxially grown semiconductor using prior art techniques then creates a reflective mirror.

A second technique etches the active layer 11 of the laser diode 10 as far as the substrate 8 and then deposits a polymer, for example benzocyclobutene (BCB), which is then etched to obtain a reflective mirror.

The above two techniques can also be combined into a third one, by depositing polymer into the etched epitaxially grown semiconductor to have a semiconductor/polymer alternation instead of a semiconductor/air or polymer/air alternation.

According to one particular feature of the invention, the fixed reflector 15 and the mobile reflector 20 each have a reflectivity R greater than or equal to 90%; this is to compensate for the short length $L_1$ of the active section 1. The condition at the laser threshold is expressed by the following equation:

$$\alpha = 1/L_1 \log(l/R)$$

In accordance with the invention, the mobile mirror 20 is associated with a MEM controller previously described.

The mobile mirror 20 can be made using prior art techniques such as anisotropic etching on silicon, micropolishing on nickel or dielectric deposition on silicon.

The laser die 10 is mounted on a base 50, for example a silicon base, and to complete the cavity 5 the mobile mirror 20 is fixed to the base 50 so that it is face-to-face with the rear face of the die 10, which advantageously carries an antireflection coating.

The tuning range of the laser depends greatly on the materials used in its fabrication, since they determine the refractive indices.

The active section 1 of the cavity 5 consists of the gain medium of the active layer 11. This can be a bulk material such as InGaAsP, InGaAs or InGaAlAs, or a quantum well structure, preferably a stressed structure.

The tunable section 2 of the cavity is air, or a gas for an application to gas detector, for example, the presence of a gas modifying the refractive index of the tunable section and thereby modifying the emission wavelength of the laser.

Figure 6:
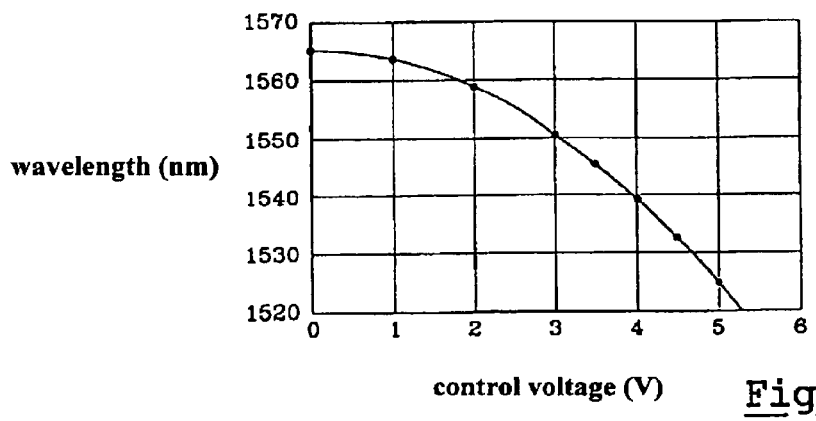
FIG. 6 is a graph of the emission wavelength of the laser according to the invention as a function of the control voltage.

The FIG. 6 graph shows clearly the continuous tuning range of the laser according to the invention. The variation in the emission wavelength of the laser is directly related to the variation in the length $L_2$ of the tunable section 2 of the cavity 5 of the laser. This variation in the length $L_2$ is in turn related to the square of the MEM control voltage.

The following relation has been established:

$$\Delta\lambda = 2\Delta L_2$$

where $\Delta L_2 = k*V^2$ and
k is a constant whose value has been determined as 0.8 nm/V$^2$.

What is claimed is:

1. A tunable edge-emitting semiconductor laser, comprising:
   a base;
   a laser diode coupled to die base;
   a fixed reflector coupled to the base; and
   an adjustable reflector coupled to the base such that the laser diode is disposed between the fixed reflector and the adjustable reflector, the adjustable reflector positioned with respect to the fixed reflector to delimit a resonant cavity having an active section with a gain length $L_1$ and a tunable section of length $L_2$.
   wherein a total length of the active section and the tunable section is less than or equal to 20 μm, and
   wherein a tuning range of the laser is continuous.

2. The tunable laser according to claim 1, wherein the length $L_1$ of the active section is from 5 μm to 12 μm.

3. The tunable laser according to claim 1, wherein the length $L_2$ of the tunable section depends on the tuning range of the laser in accordance with the following equation:

$$\Delta\lambda = \lambda^2/2(n_1L_1 + n_2L_2),$$

where Δλ is the tuning range of the laser,
λ is the emission wavelength of the laser, and
$n_1$ and $n_2$ are the respective refractive indices of the active and tunable sections of the laser cavity.

4. The tunable laser according to claim 3, wherein the tuning range is greater than or equal to 30 nm.

5. The tunable laser according to claim 1, wherein the fixed reflector and the adjustable reflector each have a reflectivity greater than or equal to 90%.

6. The tunable laser according to claim 1, wherein the fixed reflector is an etched mirror.

7. The tunable laser according to claim 6, wherein the etched mirror of the fixed reflector is an alternation of semiconductor and air.

8. The tunable laser according to claim 6, wherein the etched mirror of the fixed reflector is an alternation of polymer and air.

9. The tunable laser according to claim 6, wherein the etched mirror of the fixed reflector is an alternation of semiconductor and polymer.

10. The tunable laser according to claim 6, wherein the fixed reflector is on a front face of the active section.

11. The tunable laser according to claim 1, wherein a rear face of the active section is antireflection treated.

12. The tunable laser according to claim 1, wherein the adjustable reflector is a mirror external to the laser cavity.

13. The tunable laser according to claim 12, characterized in that the adjustable reflector is of etched silicon.

14. The tunable laser according to claim 12, wherein the adjustable reflector comprises nickel.

15. The tunable laser according to claim 12, wherein the adjustable reflector comprises dielectric deposited on silicon.

16. The tunable laser according to claim 12, wherein the adjustable reflector is controlled by a micro-electromechanical (MEM) controller.

17. The tunable laser according to claim 1, wherein the tunable section includes an air area.

18. The tunable laser according to claim 1, wherein the tunable section includes an gas area.

* * * * *